(12) United States Patent
Van Bommel et al.

(10) Patent No.: US 11,674,644 B2
(45) Date of Patent: Jun. 13, 2023

(54) LED FILAMENT LAMP

(71) Applicant: SIGNIFY HOLDING B.V., Eindhoven (NL)

(72) Inventors: Ties Van Bommel, Horst (NL); Rifat Ata Mustafa Hikmet, Eindhoven (NL); Robert Jacob Pet, Waalre (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 38 days.

(21) Appl. No.: 17/605,867

(22) PCT Filed: Apr. 23, 2020

(86) PCT No.: PCT/EP2020/061363
§ 371 (c)(1),
(2) Date: Oct. 22, 2021

(87) PCT Pub. No.: WO2020/221653
PCT Pub. Date: Nov. 5, 2020

(65) Prior Publication Data
US 2022/0196214 A1    Jun. 23, 2022

(30) Foreign Application Priority Data
May 2, 2019    (EP) .................................. 19172174

(51) Int. Cl.
*F21K 9/232*     (2016.01)
*F21Y 107/00*    (2016.01)
*F21Y 115/10*    (2016.01)

(52) U.S. Cl.
CPC ........... *F21K 9/232* (2016.08); *F21Y 2107/00* (2016.08); *F21Y 2115/10* (2016.08)

(58) Field of Classification Search
CPC .............................. F21K 9/232; F21Y 2107/00
See application file for complete search history.

(56) References Cited

U.S. PATENT DOCUMENTS

2010/0320892 A1   12/2010   Yu
2012/0217862 A1    8/2012   Matsuda et al.
(Continued)

FOREIGN PATENT DOCUMENTS

CN    104747914 A    7/2015
CN    205402603 U    7/2016
(Continued)

*Primary Examiner* — Karabi Guharay

(57) ABSTRACT

There is provided a light emitting diode, LED, filament lamp (100) which has a longitudinal axis (LA) and provides LED filament lamp light (101). The LED filament lamp (100) comprises a LED filament (102) which comprises a light transmissive, elongated substrate (103). Said substrate (103) has a first main surface (105) at a first side (105') and a second main surface (106) at a second side (106') opposite to the first side (105'). A plurality of LEDs (104) is mounted only onto said first main surface (105) and configured to emit LED light (107). An encapsulant (108, 114) covers the plurality of LEDs (104) and at least part of said first main surface (105). The LED filament (102) by a specific distribution of beam modifying material (115', 115", 109', 109") comprises at least a luminescent material (109', 109") provided in the encapsulant, and is configured to emit first LED filament light (112) in a first main direction (D1) away from the first main surface (105) and having a first color point x1,y1, and to emit second LED filament light (113) in a second main direction (D2) away from the second main surface (106) having a second color point x2,y2. The first main direction (D1) is opposite to the second main direction (D2), and, wherein (i) |x1-x2|≥0.05 and/or (ii) |y1-y2|≥0.05 applies.

15 Claims, 8 Drawing Sheets

(56) References Cited

U.S. PATENT DOCUMENTS

| | | | | |
|---|---|---|---|---|
| 2015/0003038 A1* | 1/2015 | Liu | ................... | F21K 9/00 |
| | | | | 438/27 |
| 2015/0069442 A1 | 3/2015 | Liu et al. | | |
| 2015/0070871 A1* | 3/2015 | Chen | ................ | F21K 9/232 |
| | | | | 362/84 |
| 2020/0303355 A1* | 9/2020 | Wang | ............... | C09K 11/77348 |

FOREIGN PATENT DOCUMENTS

| | | |
|---|---|---|
| CN | 207438197 U | 6/2018 |
| CN | 207962121 U | 10/2018 |

\* cited by examiner

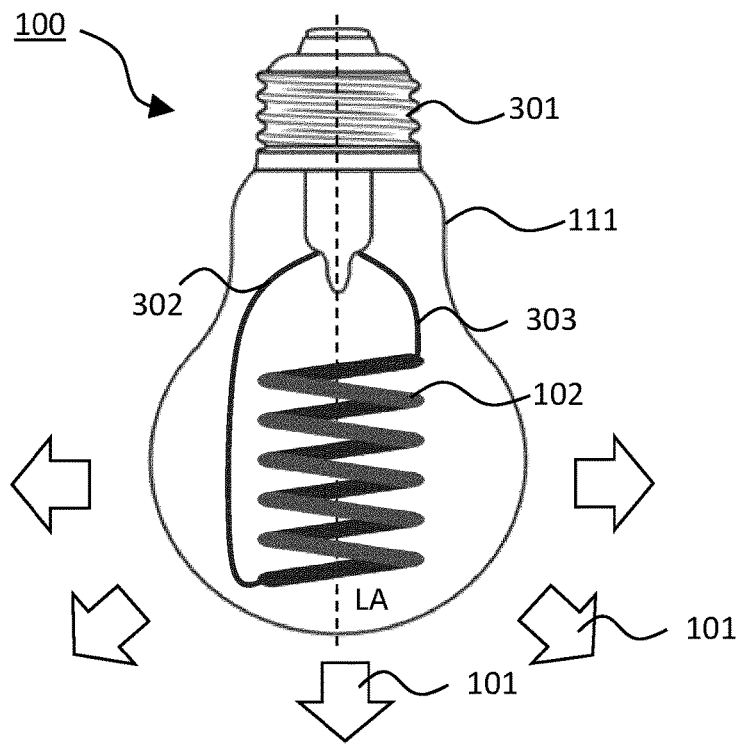
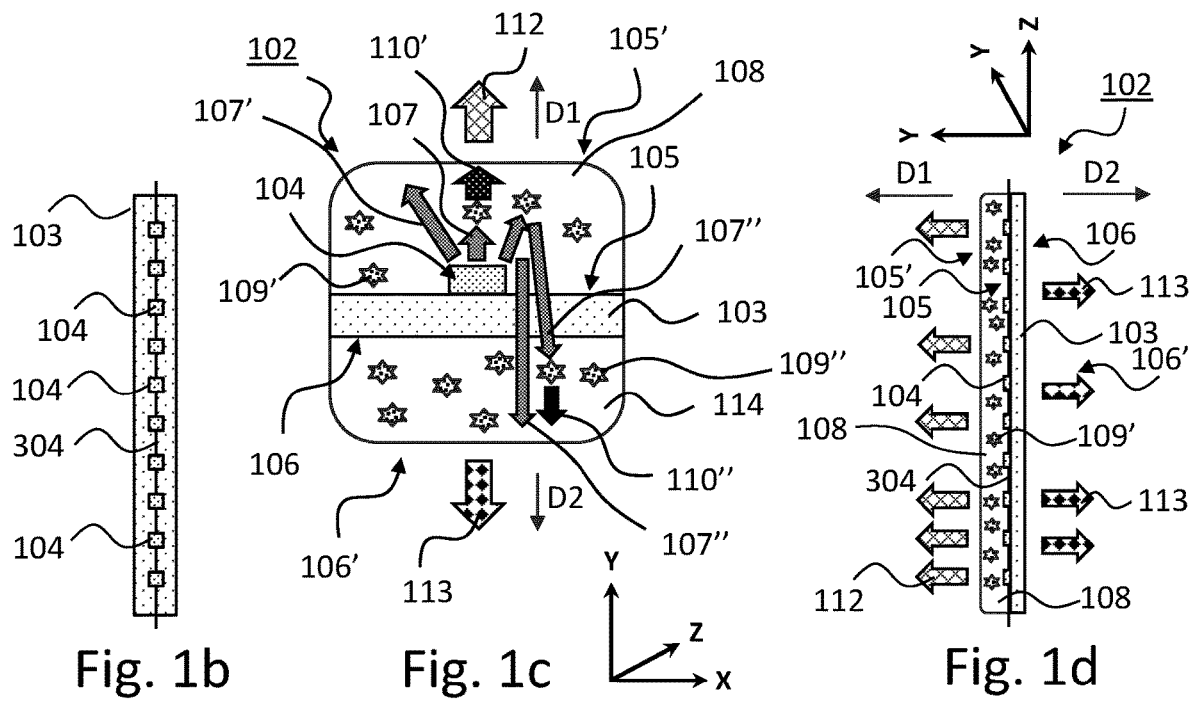
Fig. 1a
Fig. 1b  Fig. 1c  Fig. 1d

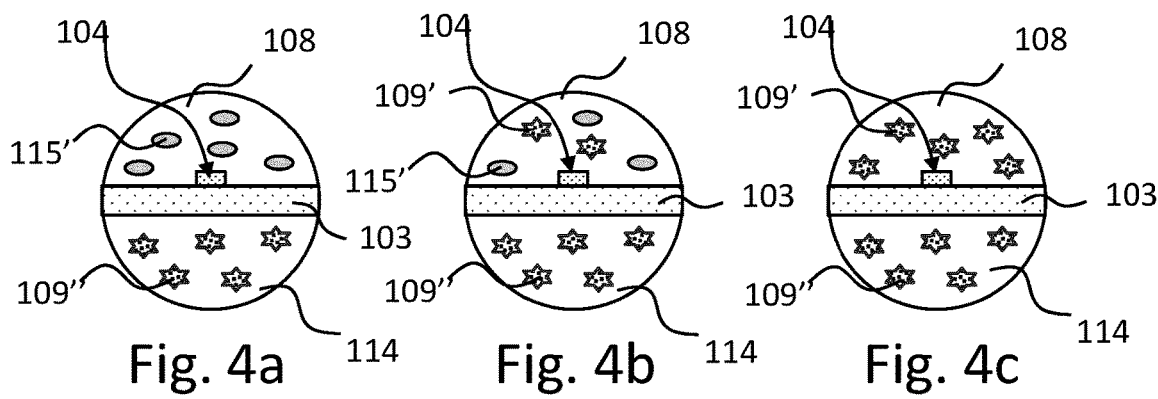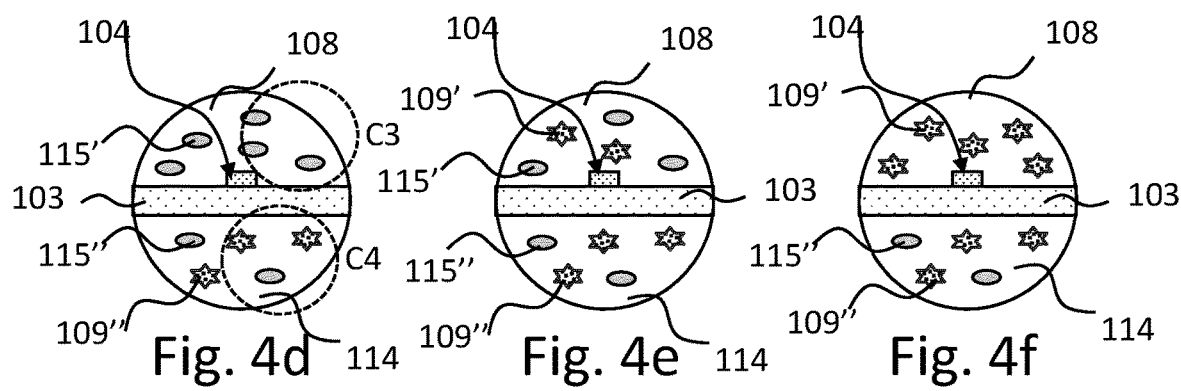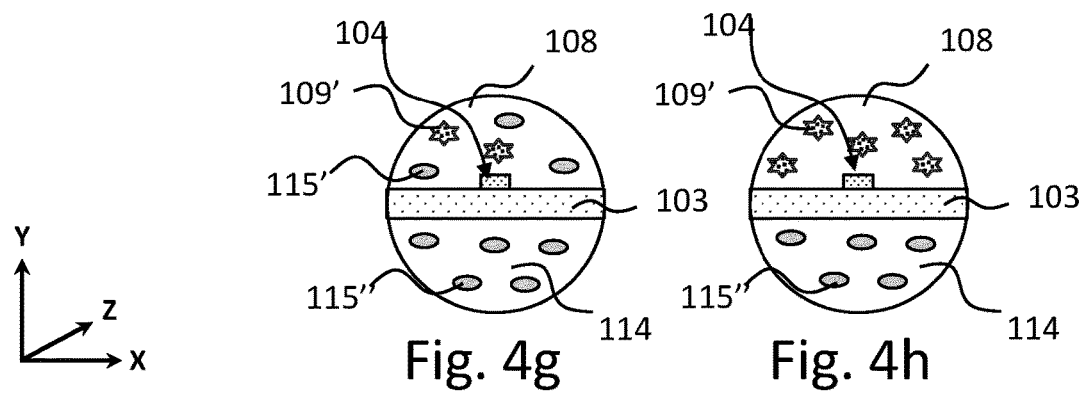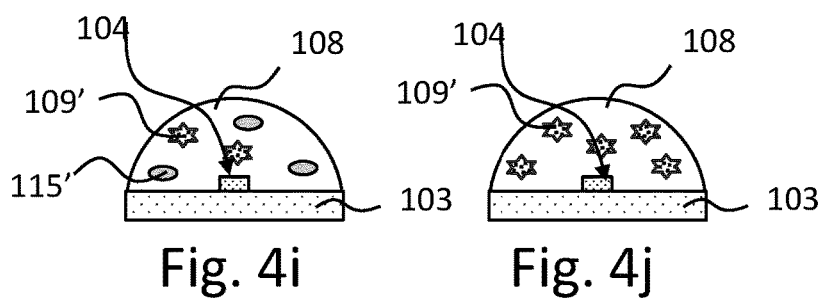

LED FILAMENT LAMP

CROSS-REFERENCE TO PRIOR APPLICATIONS

This application is the U.S. National Phase application under 35 U.S.C. § 371 of International Application No. PCT/EP2020/061363, filed on Apr. 23, 2020, which claims the benefit of European Patent Application No. 19172174.5, filed on May 2, 2019. These applications are hereby incorporated by reference herein.

FIELD OF THE INVENTION

The present invention generally relates to a light emitting diode (LED) filament lamp. The present invention further relates to a luminaire comprising said LED filament lamp.

BACKGROUND OF THE INVENTION

Incandescent lamps are rapidly being replaced by LED based lighting solutions. It is nevertheless appreciated and desired by users to have retrofit lamps which have the look of an incandescent lamp. For this purpose, one can simply make use of the infrastructure for producing incandescent lamps based on a (glass) envelope and replace the filament with LEDs emitting white light. One of the concepts is based on LED filaments placed in such an envelope. The appearances of these lamps are highly appreciated as they look highly decorative.

One of such LED based solutions is known from US 2012/0217862 A1, describing a lamp comprising a LED module having a translucent board in the shape of a plate and a plurality of LEDs mounted on the board such as to form two lines of LEDs. The LED module further comprises a sealing component for sealing the LEDs such that the lines of LEDs, when in operation, give the impression of a filament. The LED module further comprises lines, wiring and power supply for the LEDs.

US 2015/069442 A1 discloses LED assemblies and related LED light bulbs. An LED assembly comprises a flexible, transparent substrate, an LED chip on the first surface and electrically connected to two adjacent conductive sections, and a first wavelength conversion layer, formed on the first surface to substantially cover the LED chip. The flexible, transparent substrate comprises first and second surfaces opposite to each other, and several conductive sections, which are separately formed on the first surface.

In order to improve the nostalgic or vintage look of LED filament lamps, the LED filaments of filament lamps typically provide warm white light i.e. light of a very low color temperature. The color temperature is typically below 2700 K such as for example 2500 K or 2300 K. Some LED filaments lamps provide light of an ultra-low color temperature such as for example 2200 K or 2000 K. A low color temperature source will look reddish, which is appreciated. However, a drawback of this solution is that when using these LED filament lamps for general illumination purposes color recognition is unsatisfactory. These known LED filament lamps provide light of low quality.

With the development of the LED filament lamps, new demands on functionality such as decorative lighting effects emerge. It is therefore desired to have more variations in this LED filament lamp concept to satisfy the needs of different customers. However, decorative lighting effects may have a severe impact in the light quality.

SUMMARY OF THE INVENTION

It is therefore an object of the present invention to provide an improved or alternative LED filament lamp which overcomes or at least alleviate at least one of the above-discussed problems of the prior art.

The present invention discloses a LED filament lamp in accordance with the independent claim 1. Preferred embodiments are defined by the dependent claims.

According to a first aspect of the invention, a LED filament lamp is provided which has a longitudinal axis and provides LED filament lamp light. The LED filament lamp comprises a LED filament and a light transmissive envelope. The LED filament comprises a light transmissive, elongated substrate. Said substrate has a first main surface at a first side and a second main surface at a second side opposite to the first side. A plurality of LEDs is mounted only onto said first main surface and configured to emit LED light. An encapsulant covers (i) the plurality of LEDs and at least part of said first main surface or (ii) the plurality of LEDs and at least part of said first main surface and at least part of said second main surface. The encapsulant comprises a luminescent material at the first side and/or at the second side. The luminescent material is configured for converting at least a portion of LED light into converted LED light. The light transmissive envelope at least partly enclosing the LED filament. The LED filament is configured to emit first LED filament light in a first main direction away from the first main surface and to emit second LED filament light in a second main direction away from the second main surface. The first main direction is opposite to the second main direction. The first LED filament light comprises a first light portion of LED light and/or a first converted light portion of converted LED light. The second LED filament light comprises a second light portion of LED light and/or a second converted light portion of converted LED light. The LED filament lamp light is composed of the first LED filament light which has a first color point x1,y1 and of the second LED filament light has a second color point x2,y2. One or more of (i) $|x1-x2|\geq 0.05$ and/or (ii) $|y1-y2|\geq 0.05$ applies.

Hence the invention provides a LED filament lamp that is able to provide improved decorative lighting. The reason is that instead of a LED filament lamp having a LED filament providing LED filament light emitted from both sides of the LED filament without deviation in color or color temperature, a LED filament lamp having a LED filament is used which provides first LED filament light from a first LED filament surface and second LED filament light from a second LED filament surface with deviation in color (temperature). The at least one LED filament according to the invention is configured to emit first LED filament light in a first main direction away from the first main surface and to emit second LED filament light in a second main direction away from the second main surface. The first main direction is opposite to the second main direction. The first main surface is opposite to the second main surface. The first LED filament light comprises a first light portion of LED light and/or a first converted light portion of converted LED light. The second LED filament light comprises a second light portion of LED light and/or a second converted light portion of converted LED light. The LED filament lamp light is composed of the first LED filament light which has a first color point x1,y1 and of the second LED filament light has a second color point x2,y2. One or more of (i) $|x1-x2|\geq 0.05$ and/or (ii) |y1-y2|≥0.05 applies. Since the LED filament lamp light is composed of first LED filament light and second LED filament light, the LED filament lamp will have a decorative look and/or appearance.

A LED filament lamp, for example, disclosed in US 2012/0217862 A1 is unable to provide decorative lighting with improved decorative look and/or appearance. The reason is that the light emitted from these LED filament lamps is that both sides of the LED filament emit light without deviation in color (temperature).

Each spectral distribution has an accompanying color point x, y (CIE coordinates (especially CIE 1931 color space chromaticity)). These are herein indicated as x1,y1 as the color point for the first LED filament light and as x2,y2 as the color point for the second LED filament light. Colors and color points (x,y) are specified with the CIE xy chromaticity diagram. When two or more colors are additively mixed, the x and y chromaticity coordinates of the resulting color ($x_{mix}, y_{mix}$) may be calculated from the chromaticities of the mixture components ($x_1, y_1$; $x_2, y_2$; . . . ; $x_n, y_n$) and their corresponding luminances ($L_1, L_2, \ldots, L_n$).

Alternatively, the invention can be described as:

A light emitting diode, LED, filament lamp having a longitudinal axis, providing LED filament lamp light, the LED filament lamp comprising:

a LED filament comprising a light transmissive, elongated substrate, said substrate having a first main surface at a first side and a second main surface at a second side opposite to the first side, a plurality of LEDs is mounted only onto said first main surface and configured to emit LED light, an encapsulant covering the plurality of LEDs and at least part of said first main surface, wherein the LED filament by a specific distribution of beam modifying material comprising at least a luminescent material provided in the encapsulant, is configured to emit first LED filament light in a first main direction away from the first main surface and having a first color point x1,y1, and to emit second LED filament light in a second main direction away from the second main surface having a second color point x2,y2, wherein the first main direction is opposite to the second main direction, and, wherein (i) |x1-x2|≥0.05 and/or (ii) |y1-y2|≥0.05 applies.

The first side a beam modifying material being at least one of a luminescent material and a scattering material. When the first side comprises the luminescent material the encapsulant comprises at the second side scattering material, and/or luminescent material or is free from beam modifying material or the second side is free from an encapsulant. When the first side comprises only scattering material the encapsulant comprises at the second side at least the luminescent material.

The beam modifying material may modify the beam spatial distribution and/or spectral distribution. The spatial distribution may be modified using a luminescent material and/or a scattering material. The spatial light distribution may be modified by a luminescent material by light conversion and/or scattering of light in case a inorganic luminescent material is used. The spectral distribution may be modified using a luminescent material.

The luminescent material may be a phosphor such as an inorganic phosphor, an organic phosphor, and/or quantum dots/rods. Inorganic phosphor (preferably particles larger than 1 micrometer, more preferably larger than 5 micrometer, most preferably larger than 10 micrometer) may provide next to light conversion also light scattering.

The LED filament may have the feature that one or more of (i) |x1-x2|≥0.1 and/or (ii) |y1-y2|≥0.1 applies. The obtained effect is improved decorative lighting. The reason is a larger difference in color point between the first LED filament light and the second LED filament light.

The LED filament may have the feature that one or more of (i) |x1-x2|≥0.15 and/or (ii) |y1-y2|≥0.15 applies. The obtained effect is improved decorative lighting. The reason is a larger difference in color point between the first LED filament light and the second LED filament light.

The LED filament may have the feature that one or more of (i) |x1-x2|≥0.2 and/or (ii) |y1-y2|≥0.2 applies. The obtained effect is even further improved decorative lighting. The reason is an even larger difference in color point between the first LED filament light and the second LED filament light.

The LED filament may have the feature that one or more of (i) 0.05≤|x1-x2|≤0.2 and/or (ii) 0.05≤|y1-y2|≤0.2 applies. More preferably, the LED filament may have the feature that one or more of (i) 0.07≤|x1-x2|≤0.15 and/or (ii) 0.07≤|y1-y2|≤0.15 applies. The obtained effect is improved decorative lighting and functional lighting. The reason is that there is a difference in color point between the first LED filament light and the second LED filament light, but the difference is not too large to be annoying.

The first LED filament light may be white light and the second LED filament light may be white light. The first LED filament light may have a first color temperature and the second LED filament light may have a second color temperature. The difference in color temperature may be preferably at least 500 K, more preferably at least 700 K, most preferably at least 900 K. For example, the first LED filament light may be 2500 K and the second LED filament light may be 3500 K.

The first LED filament light may be white light and the second LED filament light may be white light with a tint or colored light. Example of white light with a tint include but are not limited to greenish white light, magenta white light, cyan white light and reddish white light. For example, the first LED filament light may be 3000 K and the second LED filament light may be reddish white light.

The second LED filament light may be white light and the first LED filament light may be white light with a tint or colored light. Example of white light with a tint include but are not limited to greenish white light, magenta white light, cyan white light and reddish white light. For example, the second LED filament light may be 3000 K and the first LED filament light may be reddish white light.

The first LED filament light may be white light with a first tint and the second LED filament light may be white light with a second tint. The first tint and second tint is different. Example of white light with a tint include but are not limited to greenish white light, magenta white light, cyan white light and reddish white light. For example, the first LED filament light may be greenish white light and the second LED filament light may be reddish white light.

The LED filament may have the feature that the encapsulant at the first side is free from the luminescent material and comprises a light scattering material. The encapsulant at the second side comprises the luminescent material. The obtained effect is a high contrast in color or color point between the first LED filament light and the second LED filament light. The reason is that the LED light is (almost) not converted in the encapsulant at the first side, but only converted in the encapsulant at the second side.

The LED filament lamp has the feature wherein the second main surface does not comprise any LEDs. In other words, no LED(s) is mounted onto said second main surface. The obtained effect is a low-cost LED filament lamp architecture providing decorative effect. The reason is that only LEDs needs to be provided on the first main surface.

The LED filament may have the feature that the encapsulant at the first side comprises the luminescent material and the encapsulant at the second side comprises the luminescent material, and wherein at least one of the following applies:

the first thickness, T1, of the encapsulant at the first side is lower than the second thickness, T2, of the encapsulant at the second side, and the first concentration, C1, of the luminescent material in the encapsulant at the first side is lower than the second concentration, C2, of the luminescent material in the encapsulant at the second side, and the luminescent material (109') at the first side (105') may be of a first type, P1, and the luminescent material (109") at the second side (106') may be of a second type, P2, different from the first type P1. The obtained effect is a high contrast in color or color point between the first LED filament light and the second LED filament light. The obtained effect is a subtle or well-defined difference in color point between the first LED filament light and the second LED filament light. The reason is that the degree and/or type of conversion in the encapsulant at the first side differs from the degree and/or type of conversion in the encapsulant at the second side. In the encapsulant at the first side there may be no conversion at all. Preferably T1<0.8T2, more preferably T1<0.6T2, most preferably T1<0.5T2. The larger the difference in thickness of the encapsulant, the higher the contrast in color or color point between the first LED filament light and the second LED filament light. Preferably C1<0.8C2, more preferably C1<0.6C2, most preferably C1<0.5C2. The larger the difference in concentration of the luminescent material in the encapsulant, the higher the contrast in color or color point between the first LED filament light and the second LED filament light. The first type of luminescent material P1 may emit light of a different color than the second type of luminescent material P2.

The luminescent material may be a first luminescent material at the first side and a second luminescent material at the second side. The first luminescent material and the second luminescent material may be the same. The first luminescent material and the second luminescent material may be different.

The LED filament may have the feature that the encapsulant comprises a light scattering material at the first side and/or at the second side, wherein the concentration, C3, of the light scattering material in the encapsulant at the first side is higher than the concentration, C4, of the light scattering material in the encapsulant at the second side. The obtained effect is a high contrast in color or color point between the first LED filament light and the second LED filament light. The obtained effect is a subtle or well-defined difference in color point. The reason is that more LED light is directed directly to the encapsulant at the second side without being converted in the encapsulant at the first side and at least part of it will be converted in the encapsulant at the second side. The reason is that the degree and/or type of conversion in the encapsulant at the first side differs from the degree and/or type of conversion in the encapsulant at the second side. Preferably C4<0.8C3, more preferably C4<0.6C3, most preferably C4<0.5C3. The larger the difference in concentration of the scattering material in the encapsulant, the higher the contrast in color or color point between the first LED filament light and the second LED filament light.

A subtle or well-defined difference in color point (especially in color temperature) between the first LED filament light and the second LED filament light can be obtained by (controlling the degree and/or type of) conversion of light at both sides of the light transmissive, elongated substrate. Thus, preferably, at each side of the light transmissive, elongated substrate some light conversion occurs.

The scattering material may be a first scattering material at the first side and a second scattering material at the second side. The first scattering material and the second scattering material may be the same. The first scattering material and the second scattering material may differ in concentration. The first scattering material and the second scattering material may be different. For example, they may differ in particle size (distribution). Scattering material which may be used include but are not limited to Al2O3, BaSO4 and/or TiO2.

The LED filament may have the feature that the encapsulant only comprises at the first side the luminescent material. The encapsulant at the second side comprises a light scattering material, or the second side is free from an encapsulant. The obtained effect is a high contrast in color or color point between the first LED filament light and the second LED filament light. The reason is that no LED light is converted in the encapsulant at the second side.

The LED filament may have the feature that the LED filament is transversely arranged and curved and/or bend around the longitudinal axis (LA) at least over an angle θ of 180 degrees. More preferably the LED filament is transversely arranged and curved and/or bended around the longitudinal axis (LA) at least over an angle θ of 270 degrees. Most preferably, the LED filament is transversely arranged and curved and/or bended around the longitudinal axis (LA) at least over an angle θ of 360 degrees. The LED filament according to this embodiment provides decorative effects and high quality homogeneous and/or omnidirectional lighting. The reason is that the first LED filament light and the second LED filament light are emitted in multiple lamp directions. Preferably, the first LED filament light and the second LED filament light is emitted in all lamp directions. More preferably, the first LED filament light has a omnidirection distribution and the second LED filament has a omnidirectional distribution. The obtained effect is decorative lighting and improved functional lighting.

The LED filament may have the feature that the LED filament is longitudinal arranged and curved and/or bend alongside the longitudinal axis at least over 180 degrees. Preferably, the LED filament is longitudinal arranged and curved and/or bended alongside the longitudinal axis at least over 270 degrees. Most preferably, the LED filament is longitudinal arranged and curved and/or bended alongside the longitudinal axis at least over 360 degrees. The LED filament according to this embodiment provides decorative effects and high quality homogeneous and/or omnidirectional lighting. The reason is that the first LED filament light and the second LED filament light are emitted in multiple lamp directions. Preferably, the first LED filament light and the second LED filament light is emitted in all lamp directions. More preferably, the first LED filament light has a omnidirection distribution and the second LED filament has a omnidirectional distribution. The obtained effect is decorative lighting and improved functional lighting.

The LED filament may have the feature that the LED filament lamp light has a color temperature in a range from 2000 Kelvin to 6000 Kelvin, wherein the LED filament lamp light is at least within 15 SDCM from the black body line, and wherein the LED filament lamp light has omnidirectional light emission of substantially the same color temperature. Substantially the same color temperature preferably means variations in color temperature is below 300 K, more preferably below 200 K, most preferably below 150 K. The obtained effect is decorative lighting and improved functional lighting.

The LED filament may have the feature that the light transmissive substrate has a length axis, AL, wherein the light transmissive substrate is twisted over its length axis, AL. The light transmissive substrate may preferably have at least three full twists, more preferably at least five full twists, most preferably at least seven twists. The LED filament according to this embodiment provides decorative effects and high quality homogeneous and/or omnidirectional lighting. The reason is that the first LED filament light and the second LED filament light are emitted in multiple lamp directions. Preferably, the first LED filament light and the second LED filament light is emitted in all lamp directions. More preferably, the first LED filament light has a omnidirection distribution and the second LED filament has a omnidirectional distribution. The obtained effect is decorative lighting and improved functional lighting.

The LED filament may have the feature that the LED filament is arranged in a spiral configuration. The spiral configuration may preferably comprise at least three windings, more preferably at least five windings, most preferably at least seven windings. The LED filament according to this embodiment provides decorative effects and high quality homogeneous and/or omnidirectional lighting. The reason is that the first LED filament light and the second LED filament light are emitted in multiple lamp directions. Preferably, the first LED filament light and the second LED filament light is emitted in all lamp directions. More preferably, the first LED filament light has a omnidirection distribution and the second LED filament has a omnidirectional distribution. The obtained effect is decorative lighting and improved functional lighting.

The LED filament may have the feature that the LED filament is arranged in a meander configuration. The meander configuration may preferably comprise at least three turns, more preferably at least five turns, most preferably at least seven turns. The LED filament according to this embodiment provides decorative effects and high quality homogeneous and/or omnidirectional lighting. The reason is that the first LED filament light and the second LED filament light are emitted in multiple lamp directions. Preferably, the first LED filament light and the second LED filament light is emitted in all lamp directions. More preferably, the first LED filament light has a omnidirection distribution and the second LED filament has a omnidirectional distribution. The obtained effect is decorative lighting and improved functional lighting.

The LED filament may have the feature that the LED filament is arranged in a coil configuration. The coil configuration may preferably comprise at least three loops, more preferably at least five loops, most preferably at least seven loops. The LED filament according to this embodiment provides decorative effects and high quality homogeneous and/or omnidirectional lighting. The reason is that the first LED filament light and the second LED filament light are emitted in multiple lamp directions. Preferably, the first LED filament light and the second LED filament light is emitted in all lamp directions. More preferably, the first LED filament light has a omnidirection distribution and the second LED filament has a omnidirectional distribution. The obtained effect is decorative lighting and improved functional lighting. The coil configuration may comprise a variable pitch, variable amplitude, and/or a variable orientation.

The LED filament may have the feature that the LED filament is arranged in a helix configuration. The helix configuration may preferably comprise at least three loops, more preferably at least five loops, most preferably at least seven loops. The LED filament according to this embodiment provides decorative effects and high quality homogeneous and/or omnidirectional lighting. The reason is that the first LED filament light and the second LED filament light are emitted in multiple lamp directions. Preferably, the first LED filament light and the second LED filament light is emitted in all lamp directions. More preferably, the first LED filament light has a omnidirection distribution and the second LED filament has a omnidirectional distribution. The obtained effect is decorative lighting and improved functional lighting.

The LED filament may have the feature that the LED filament lamp comprises at least two LED filaments, wherein for all the at least two LED filaments either the respective first main surface or the respective second main surface is directed to the longitudinal axis, LA, of the LED filament lamp. The LED filament according to this embodiment provides decorative effects and high quality homogeneous and/or omnidirectional lighting. The reason is that the first LED filament light and the second LED filament light are emitted in multiple lamp directions. Preferably, the first LED filament light and the second LED filament light is emitted in all lamp directions. More preferably, the first LED filament light has a omnidirection distribution and the second LED filament has a omnidirectional distribution. The obtained effect is decorative lighting and improved functional lighting. The LED filament lamp may comprise more than two LED filaments such as for example three, four, five or six LED filaments.

The present invention discloses a luminaire in accordance with claim 15. The luminaire might have the feature that the luminaire comprises a reflector and the LED filament lamp, wherein the LED filament lamp is at least partly arranged inside the reflector. The obtained effect is that a luminaire with decorative lighting with improved functional lighting i.e. high quality of light.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1a shows a schematic side-view a LED filament lamp according to an embodiment of the present invention; and FIG. 1b shows a schematic top-view a main part of a LED filament according to an embodiment of the present invention; and FIG. 1c shows a cross-section in the XY-plane of the LED filament according to an embodiment of the present invention; and FIG. 1d shows a cross-section in the XZ plane of the LED filament according to an embodiment of the present invention; FIG. 4a-j show a cross-section in the XY-plane of the LED filament according to embodiments of the present invention.

Figure 2:
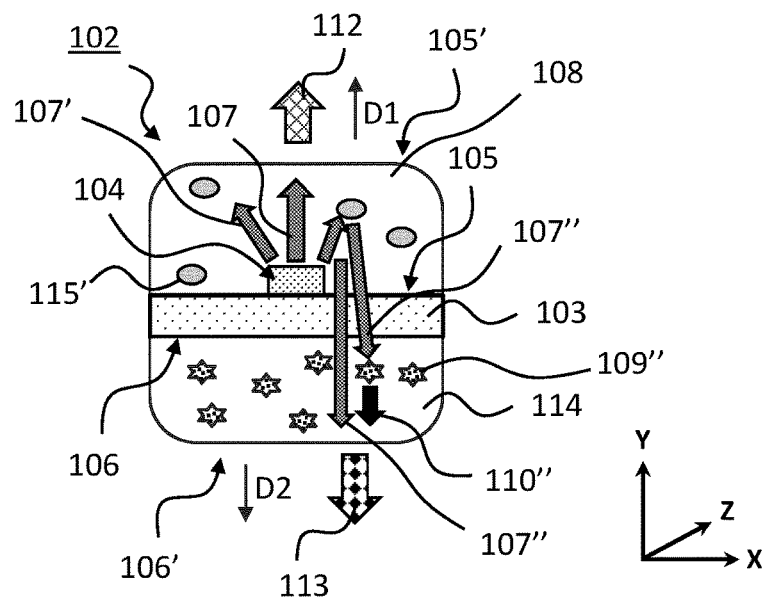
FIG. 2 shows a cross-section in the XY-plane of the LED filament according to an embodiment of the present invention.

The schematic drawings are not necessarily on scale.

The same features having the same function in different figures are referred to the same references.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and convey the scope of the invention to the skilled person.

FIG. 1a shows a schematic side-view a LED filament lamp 100 according to an embodiment of the present invention. FIG. 1b shows a schematic top-view a main part of a LED filament 102 according to an embodiment of the present invention. FIG. 1c shows a cross-section in the XY-plane of the LED filament 102 according to an embodiment of the present invention. FIG. 1d shows a cross-section in the XZ plane of the LED filament 102 according to an embodiment of the present invention. As depicted in FIG. 1a-d, the LED filament lamp 100 has a longitudinal axis LA and provides LED filament lamp light 101. The LED filament lamp 100 comprises a LED filament 102 and a light transmissive envelope 111. The LED filament 102 comprises a light transmissive, elongated substrate 103. Said substrate 103 has a first main surface 105 at a first side 105' and a second main surface 106 at a second side 106' opposite to the first side 105'. A plurality of LEDs 104 is mounted only onto said first main surface 105 and configured to emit LED light 107. An encapsulant 108, 114 covers (i) the plurality of LEDs 104 and at least part of said first main surface 105 or (ii) the plurality of LEDs 104 and at least part of said first main surface 105 and at least part of said second main surface 106. The encapsulant 108 comprises a luminescent material 109',109" at the first side 105' and/or at the second side 106'. The luminescent material 109',109" is configured for converting at least a portion of LED light 107 into converted LED light 110', 110". The converted LED light 110', 110" may also be re-converted to re-converted light. The light transmissive envelope 111 at least partly enclosing the LED filament 102. The LED filament 102 is configured to emit first LED filament light 112 in a first main direction D1 away from the first main surface 105 and to emit second LED filament light 113 in a second main direction D2 away from the second main surface 106. The first main direction D1 is opposite to the second main direction D2. The first LED filament light 112 comprises a first light portion of LED light 107' and/or a first converted light portion of converted LED light 110'. The second LED filament light 113 comprises a second light portion of LED light 107" and/or a second converted light portion of converted LED light 110". The LED filament lamp light 101 is composed of the first LED filament light 112 having a first color point x1,y1 and of the second LED filament light 113 having a second color point x2,y2. One or more of the following applies (i) |x1-x2|≥0.05 and/or (ii) |y1-y2|≥0.05. The encapsulant may be a continuous layer covering the plurality LEDs or preferably all LEDs. The LEDs may be blue and/or UV LEDs. The luminescent material may be a phosphor such as an inorganic phosphor, an organic phosphor, and/or quantum dots/rods. The LED filament lamp may comprise a cap 301. The LED filament 102 may be powered by electrical contacts 302 and 303. The encapsulant 108, 114 may comprise a polymer matrix such as for example a silicone or a poly urethane material. The light transmissive substrate 103 may be translucent and is preferably transparent. The light transmissive substrate 103 may be rigid or flexible. The rigid light transmissive substrate 103 may be made of glass, quartz, sapphire, etc. The flexible light transmissive substrate 103 may be made of a foil e.g. a thin flexible plastic material.

As depicted in FIG. 1, the LED filament lamp light 101 may have a color temperature in a range from 2000 Kelvin to 6000 Kelvin, wherein the LED filament lamp light 101 is at least within 15 SDCM from the black body line, and wherein the LED filament lamp light 101 has omnidirectional light emission 129 of the same color temperature.

FIG. 2 shows a cross-section in the XY-plane of the LED filament according to an embodiment of the present invention. As depicted in FIG. 2, the encapsulant 108 at the first side 105' is free from the luminescent material 109' and comprises a light scattering material 115'. The encapsulant 114 at the second side 106' comprises the luminescent material 109".

Figures 3A, 3B, 3C:
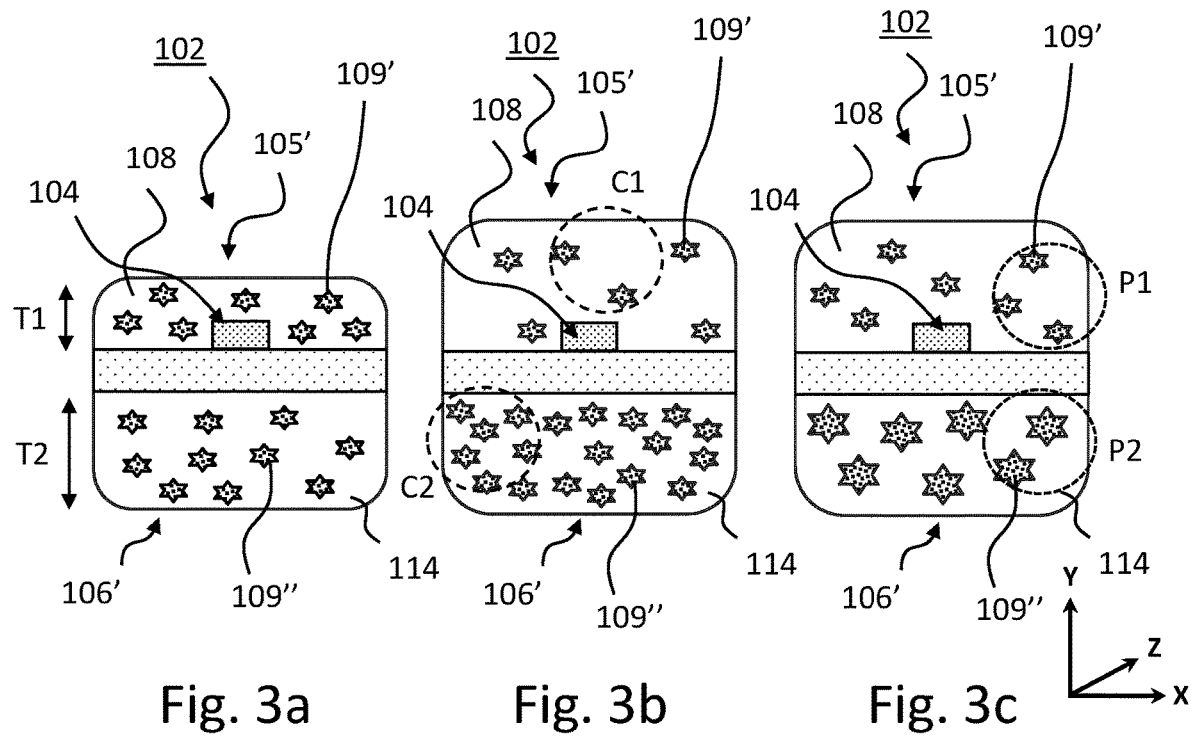
FIG. 3a-c shows a cross-sections in the XY-plane of the LED filament according to an embodiment of the present invention.

FIG. 3a-c show a cross-section in the XY-plane of the LED filament according to an embodiment of the present invention. As depicted in FIG. 3a-c, the encapsulant 108 at the first side 105' comprises the luminescent material 109' and the encapsulant 114 at the second side 106' comprises the luminescent material 109". As depicted in FIG. 3a, the first thickness, T1, of the encapsulant 108 at the first side 105' is lower than the second thickness, T2, of the encapsulant 114 at the second side 106'. As depicted in FIG. 3b, the first concentration, C1, of the luminescent material 109' in the encapsulant 108 at the first side 105' is lower than the second concentration, C2, of the luminescent material 109" in the encapsulant 114 at the second side 106'. As depicted in FIG. 3c, the luminescent material 109' at the first side 105' is of a first type, P1, and the luminescent material (109") at the second side (106') is of a second type, P2, different from the first type P1.

FIG. 4a-j show a cross-section in the XY-plane of the LED filament according to embodiments of the present invention. As depicted in FIG. 4a, the encapsulant 108 at the first side 105' comprises the (first) scattering material 115', and the encapsulant 114 at the second side 106' comprises the (second) luminescent material 109". As depicted in FIG. 4b, the encapsulant 108 at the first side 105' comprises the (first) luminescent material 109' and the (first) scattering material 115', and the encapsulant 114 at the second side 106' comprises the (second) luminescent material 109". As depicted in FIG. 4c, the encapsulant 108 at the first side 105' comprises the (first) luminescent material 109', and the encapsulant 114 at the second side 106' comprises the (second) luminescent material 109". As depicted in FIG. 4d, the encapsulant 108 at the first side 105' comprises the (first) scattering material 115', and the encapsulant 114 at the second side 106' comprises the (second) luminescent material 109" and the (second) scattering material 115". As depicted in FIG. 4e, the encapsulant 108 at the first side 105' comprises the (first) luminescent material 109' and the (first) scattering material 115', and the encapsulant 114 at the second side 106' comprises the (second) luminescent material 109" and the (second) scattering material 115". As depicted in FIG. 4f, the encapsulant 108 at the first side 105' comprises the (first) luminescent material 109', and the encapsulant 114 at the second side 106' comprises the (second) luminescent material 109" and the (second) scattering material 115". As depicted in FIG. 4g, the encapsulant 108 at the first side 105' comprises the (first) luminescent material 109' and the (first) scattering material 115', and the encapsulant 114 at the second side 106' comprises the (second) scattering material 115". As depicted in FIG. 4h, the encapsulant 108 at the first side 105' comprises the (first) luminescent material 109', and the encapsulant 114 at the second side 106' comprises the (second) scattering material 115". As depicted in FIG. 4i, the encapsulant 108 at the first side 105' comprises the (first) luminescent material 109' and the (first) scattering material 115', and there is no encapsulant 114 at the second side 106'. As depicted in FIG. 4j, the encapsulant 108 at the first side 105' comprises the (first) luminescent material 109', and there is no encapsulant 114 at the second side 106'.

As depicted in FIG. 4a, b, d, e and/or i, the encapsulant 108 comprises a light scattering material 115',115" at the first side 105' and/or at the second side 106'. The concentration, C3, of the light scattering material 115' in the encapsulant 108 at the first side 105' is higher than the concentration, C4, of the light scattering material 115" in the encapsulant 114 (if any) at the second side 106'.

As depicted in FIG. 4g-i, the encapsulant 108 only comprises at the first side 105' the luminescent material 109'. The encapsulant 114 at the second side 106' comprises a light scattering material 115", or the second side is free from an encapsulant 114.

Configurations depicted in FIG. 4a-h are preferred over the configurations depicted in FIG. 4i-j in terms of homogeneous lighting. The reason is that the encapsulant 114 at the second side 106' does not contain a luminescent material 109', 109" or a scatting material 115', 115". Configurations depicted in FIG. 4a-f are preferred over the configurations depicted in FIG. 4g-j in terms of contrast in color or color temperature between the first LED filament light and the second LED filament light. The reason is that the encapsulant 114 at the second side 106' does not contain a luminescent material 109', 109".

Figure 5:
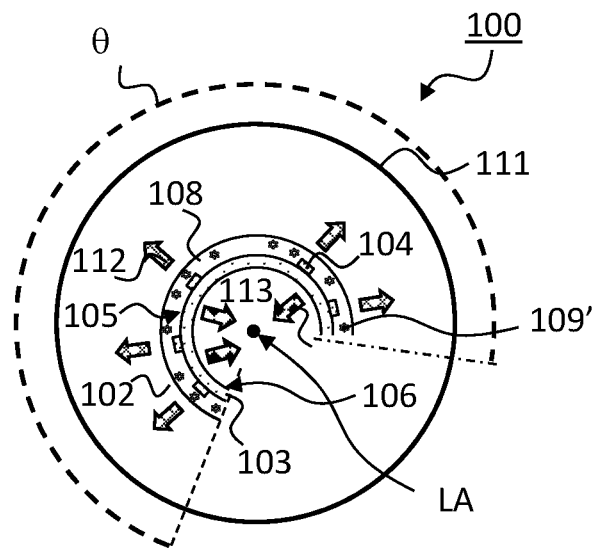
FIG. 5 shows a cross-section of a LED filament lamp according to an embodiment of the present invention.

FIG. 5 shows a cross-section of a LED filament lamp according to an embodiment of the present invention. As depicted in FIG. 5, the LED filament 102 is transversely arranged and curved, but may also be bend, around the longitudinal axis LA at least over an angle θ of 180 degrees such as for example 270 degrees.

Figure 6:
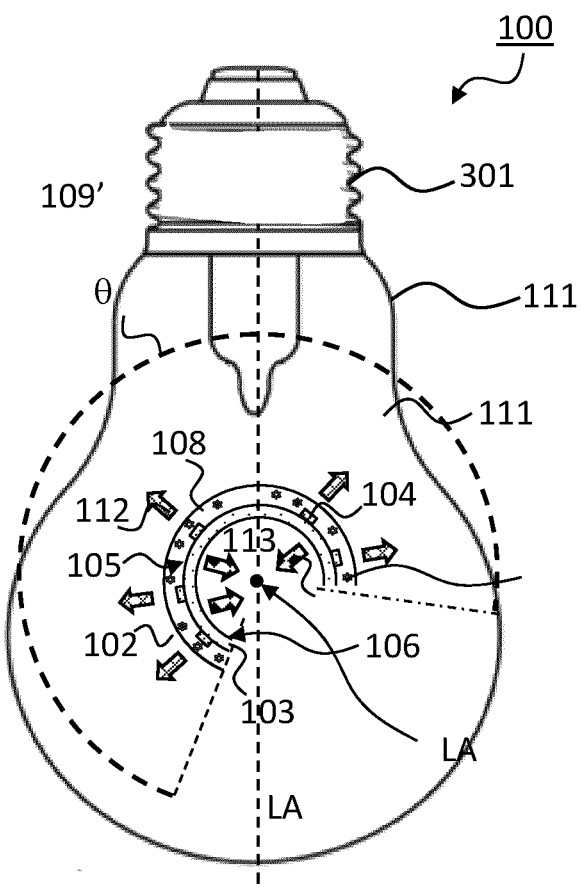
FIG. 6 shows a cross-section of a LED filament lamp according to an embodiment of the present invention.

FIG. 6 shows a cross-section of a LED filament lamp according to an embodiment of the present invention. As depicted in FIG. 6, the LED filament 102 is longitudinal arranged and curved and/or bend alongside the longitudinal axis LA at least over 180 degrees such as for example 270 degrees.

Figure 7:
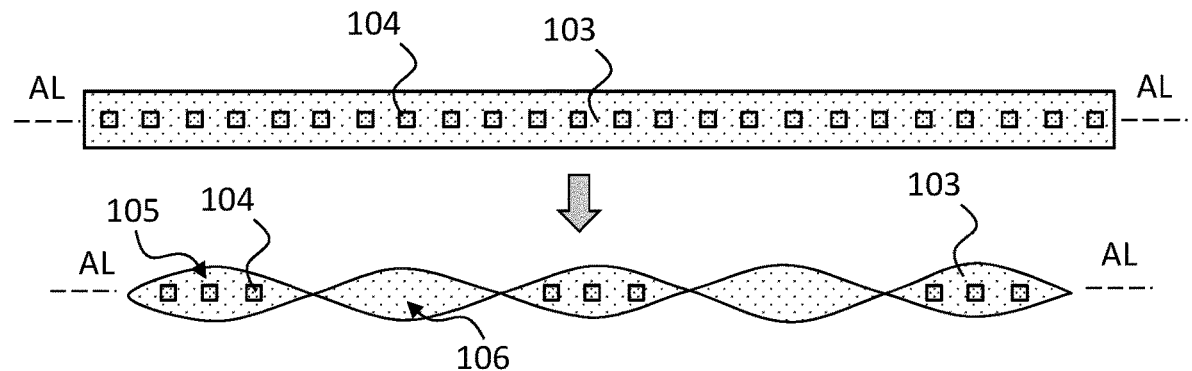
FIG. 7 shows a top-view of a main part of the LED filament according to an embodiment of the present invention.

FIG. 7 shows a top-view of a main part of the LED filament according to an embodiment of the present invention. As depicted in FIG. 7, the light transmissive substrate 103 has a length axis, AL, wherein the light transmissive substrate 103 is twisted over its length axis AL. the light transmissive substrate has at least three full twists.

Figure 8:
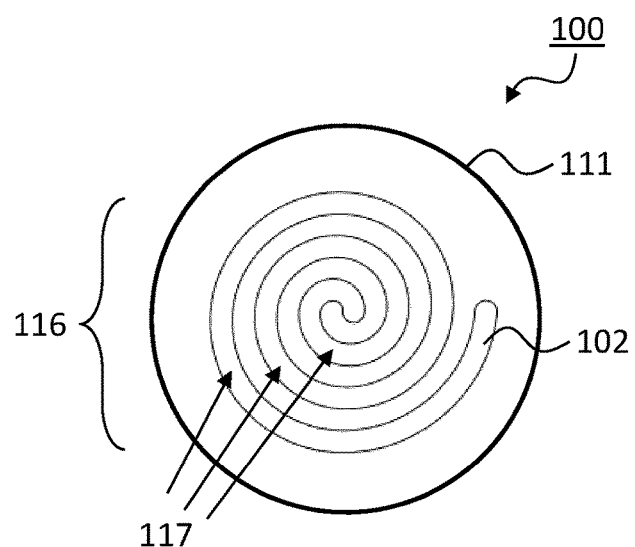
FIG. 8 shows a top-view of a LED filament lamp according to an embodiment of the present invention.

FIG. 8 shows a top-view of a LED filament lamp according to an embodiment of the present invention. As depicted in FIG. 8, the LED filament 102 is arranged in a spiral configuration 116. The spiral configuration 116 comprises at least three windings 117.

Figure 9:
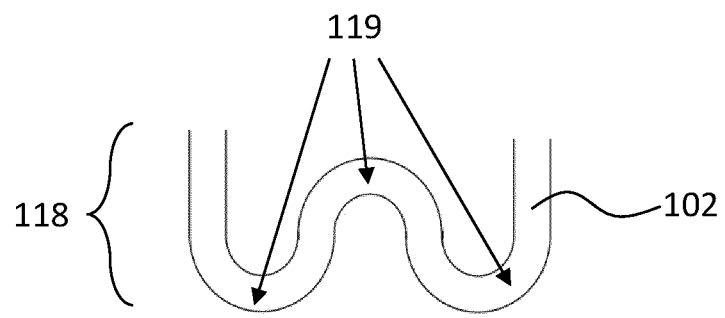
FIG. 9 shows a side-view of a LED filament according to an embodiment of the present invention.

FIG. 9 shows a side-view of a LED filament according to an embodiment of the present invention. As depicted in FIG. 9, the LED filament 102 is arranged in a meander configuration 118. The meander configuration 118 comprises at least three turns 119.

Figure 10:
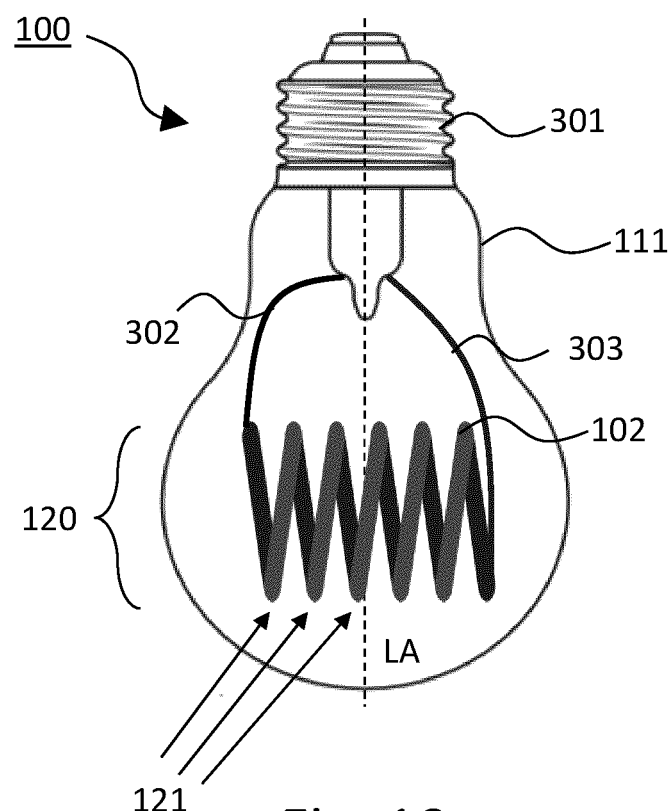
FIG. 10 shows a side-view of a LED filament lamp according to an embodiment of the present invention.

FIG. 10 shows a side-view of a LED filament lamp according to an embodiment of the present invention. As depicted in FIG. 10, the LED filament 102 is arranged in a coil configuration 120. The coil configuration 120 comprises at least three loops 121.

Figure 11:
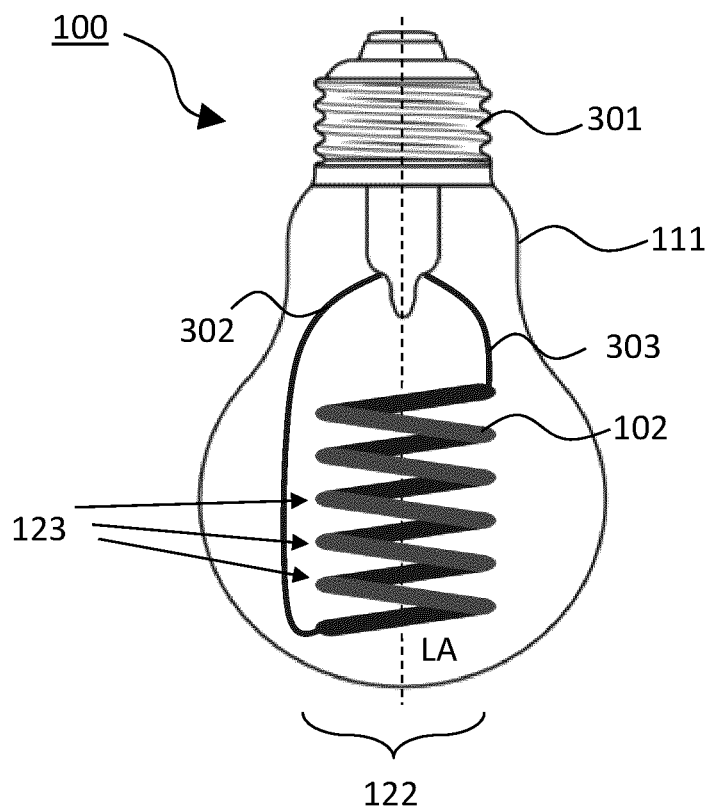
FIG. 11 shows a side-view of a LED filament lamp according to an embodiment of the present invention.

FIG. 11 shows a side-view of a LED filament lamp according to an embodiment of the present invention. As depicted in FIG. 11, the LED filament 102 is arranged in a helix configuration 122. the helix configuration comprises at least three loops 123. The helix configuration may have the property that a tangent line at any point makes a constant angle with a fixed line called the helix axis.

Figure 12:
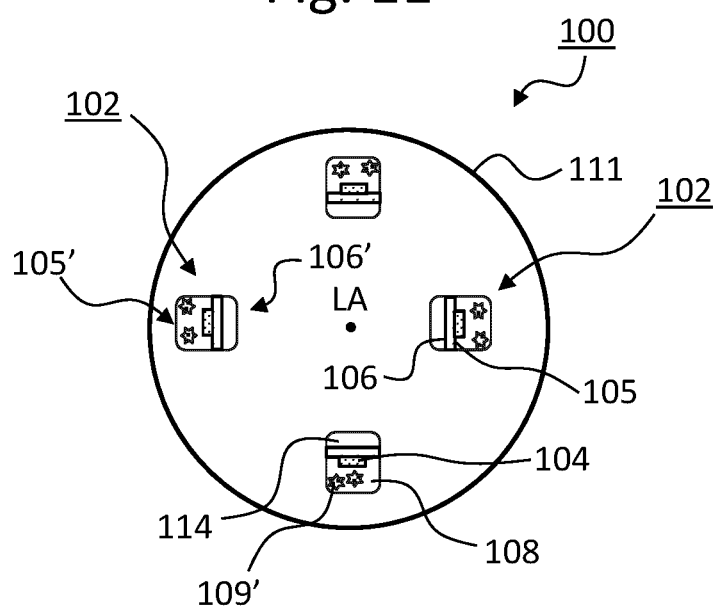
FIG. 12 shows a cross-section of a LED filament lamp according to an embodiment of the present invention.

FIG. 12 shows a cross-section of a LED filament lamp according to an embodiment of the present invention. As depicted in FIG. 12, the LED filament lamp 100 comprises four LED filaments 102. For all the LED filaments 102 either the respective first main surface 105 is directed away from the longitudinal axis LA of the LED filament lamp 100.

Figure 13:
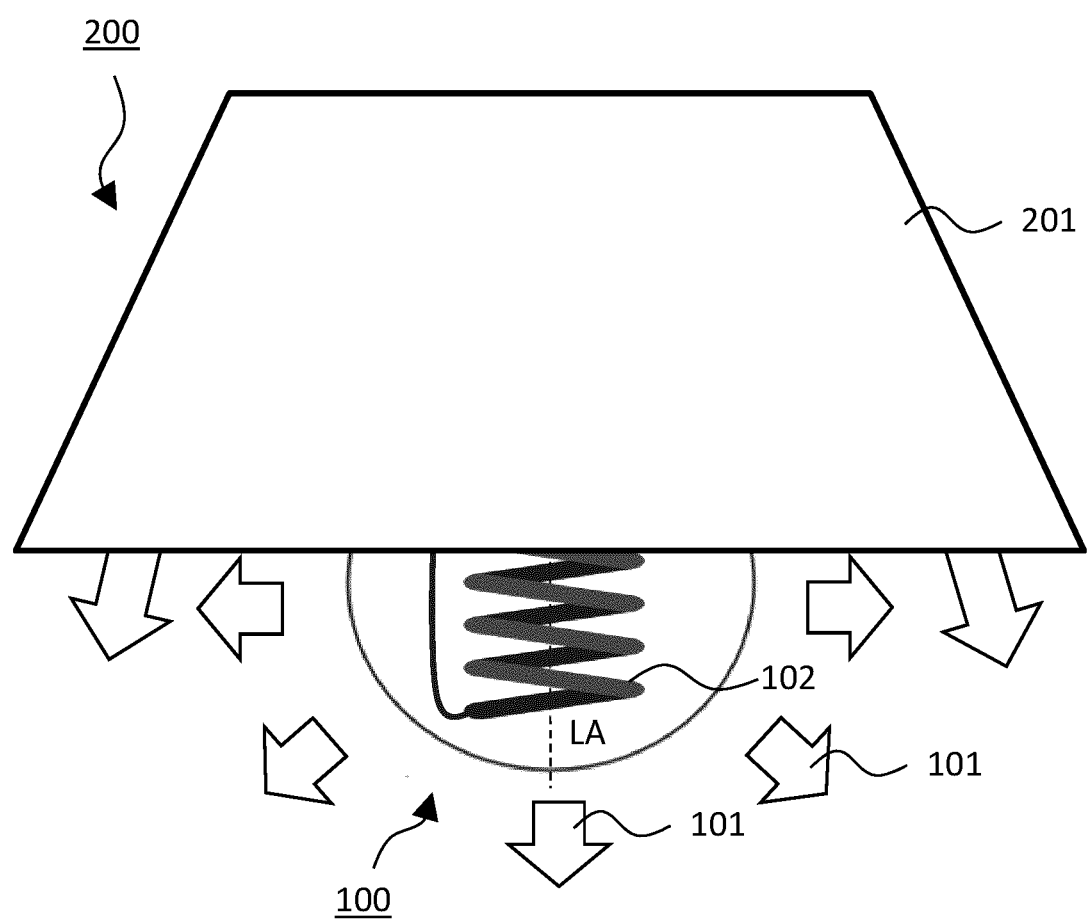
FIG. 13 shows a side-view of a luminaire comprising a LED filament lamp according to an embodiment of the present invention.

FIG. 13 shows a side-view of a luminaire comprising a LED filament lamp according to an embodiment of the present invention. As depicted in FIG. 13, the luminaire 200 comprises a reflector 201 and the LED filament lamp 100, wherein the LED filament lamp 100 is at least partly arranged inside the reflector 201.

The invention claimed is:

1. A light emitting diode, LED, filament lamp having a longitudinal axis (LA), providing LED filament lamp light, the LED filament lamp comprising a light transmissive envelope at least partly enclosing the LED filament;
wherein the LED filament comprises:
a light transmissive, elongated substrate, said substrate having a first main surface at a first side and a second main surface at a second side opposite to the first side,
a plurality of LEDs is mounted only onto said first main surface and configured to emit LED light,
an encapsulant comprising a luminescent material at the first side and/or at the second side, the luminescent material is configured for converting at least a portion of LED light into converted LED light, the encapsulant covering (i) the plurality of LEDs and at least part of said first main surface or (ii) the plurality of LEDs and at least part of said first main surface and at least part of said second main surface;
wherein the LED filament is configured to emit first LED filament light in a first main direction away from the first main surface and to emit second LED filament light in a second main direction away from the second main surface, the first main direction is opposite to the second main direction, the first LED filament light comprises a first light portion of LED light and/or a first converted light portion of converted LED light, the second LED filament light comprises a second light portion of LED light and/or a second converted light portion of converted LED light;

wherein the LED filament lamp light (101) is composed of the first LED filament light having a first color point x1,y1 and of the second LED filament light having a second color point x2,y2;

wherein the first LED filament light and the second LED filament light deviate in color or color temperature; and wherein (i) |x1−x2| 1 0.05 >0.05 applies, which is obtainable by one or more of the following features:

(i) wherein the encapsulant at the first side comprises the luminescent material and the encapsulant at the second side comprises the luminescent material, and wherein at least one of:
  the first thickness, T1, of the encapsulant at the first side is lower than the second thickness, T2, of the encapsulant at the second side, and
  the first concentration, C1, of the luminescent material in the encapsulant at the first side is lower than the second concentration, C2, of the luminescent material in the encapsulant at the second side, and
  the luminescent material at the first side is of a first type, P1, and the luminescent material at the second side is of a second type, P2, different from the first type P1;

(ii) wherein the encapsulant comprises a light scattering material, at the first side and/or at the second side, and wherein
  the concentration, C3, of the light scattering material in the encapsulant at the first side is higher than the concentration, C4, of the light scattering material in the encapsulant at the second side.

2. The LED filament lamp according to claim 1, wherein (i) | x1−x2 |>0.1 and/or (ii) | y1−y2 |>0.1 applies.

3. The LED filament lamp according to claim 1, wherein the first LED filament light is white light and the second LED filament light is white light.

4. The LED filament lamp according to claim 3, wherein the first LED filament light has a first color temperature and the second LED filament light has a second color temperature, wherein the difference between the first color temperature and the second color temperature is at least 500 K.

5. The LED filament lamp according to claim 1, wherein the first LED filament light is white light and the second LED filament light is greenish white light, magenta white light, cyan white light or reddish white light.

6. The LED filament lamp according to claim 1, wherein the LED filament is transversely arranged and curved and/or bend around the longitudinal axis (LA) at least over an angle θ of 180 degrees.

7. The LED filament lamp according to claim 1, wherein the LED filament is longitudinally arranged and curved and/or bend alongside the longitudinal axis (LA) at least over 180 degrees.

8. The LED filament lamp according to claim 1, wherein the LED filament lamp light has a color temperature in a range from 2000 Kelvin to 6000 Kelvin, wherein the LED filament lamp light is at least within 15 SDCM from the black body line, and wherein the LED filament lamp light has omnidirectional light emission of the same color temperature.

9. The LED filament lamp according to claim 1, wherein the light transmissive substrate has a length axis (AL), wherein the light transmissive substrate is twisted over its length axis (AL).

10. The LED filament lamp according to claim 1, wherein the LED filament is arranged in a spiral configuration.

11. The LED filament lamp according to claim 1, wherein the LED filament is arranged in a meander configuration.

12. The LED filament lamp according to claim 1, wherein the LED filament is arranged in a coil configuration.

13. The LED filament lamp according to claim 1, wherein the LED filament is arranged in a helix configuration.

14. The LED filament lamp according to claim 1, wherein the LED filament lamp comprises at least two LED filaments, wherein of each LED filament either the respective first main surface or the respective second main surface is directed to the longitudinal axis (LA) of the LED filament lamp.

15. A luminaire comprising a reflector and the LED filament lamp according to claim 1, wherein the LED filament lamp is at least partly arranged inside the reflector.

* * * * *